United States Patent
Meyer et al.

(10) Patent No.: US 10,351,477 B2
(45) Date of Patent: Jul. 16, 2019

(54) METHOD FOR PRODUCING A METAL-CERAMIC SUBSTRATE

(71) Applicant: Rogers Germany GmbH, Eschenbach (DE)

(72) Inventors: Andreas Meyer, Wenzenbach (DE); Fabian Hierstetter, Kurmreuth (DE)

(73) Assignee: ROGERS GERMANY GMBH, Eschenbach (DE)

( * ) Notice: Subject to any disclaimer, the term of this patent is extended or adjusted under 35 U.S.C. 154(b) by 270 days.

(21) Appl. No.: 15/102,951

(22) PCT Filed: Nov. 28, 2014

(86) PCT No.: PCT/DE2014/100420
§ 371 (c)(1),
(2) Date: Jun. 9, 2016

(87) PCT Pub. No.: WO2015/085991
PCT Pub. Date: Jun. 18, 2015

(65) Prior Publication Data
US 2016/0304405 A1 Oct. 20, 2016

(30) Foreign Application Priority Data
Dec. 10, 2013 (DE) .................. 10 2013 113 734

(51) Int. Cl.
*C08B 37/00* (2006.01)
*H01L 21/48* (2006.01)
(Continued)

(52) U.S. Cl.
CPC ........ *C04B 35/6455* (2013.01); *C04B 37/021* (2013.01); *C04B 37/025* (2013.01);
(Continued)

(58) Field of Classification Search
None
See application file for complete search history.

(56) References Cited

U.S. PATENT DOCUMENTS

| 4,325,183 A | 4/1982 | Khambatta |
| 4,693,409 A * | 9/1987 | Mizunoya ............... B32B 15/04 228/122.1 |

(Continued)

FOREIGN PATENT DOCUMENTS

| DE | 102004033933 B4 | 11/2009 |
| DE | 112010004589 T5 | 1/2013 |

(Continued)

*Primary Examiner* — Devang R Patel
(74) *Attorney, Agent, or Firm* — Cantor Colburn LLP

(57) ABSTRACT

The invention relates to a method for producing a metal-ceramic substrate including first and second metallizations and at least one ceramic layer incorporated between the first and second metallizations. Advantageously, first and second metal layers and the at least one ceramic layer are stacked superposed, and in such a way that the free edge sections, of the first and second metal layers respectively, project beyond the edges of the at least one ceramic layer and the first and second metal layers are deformed toward each other in the region of the projecting free edge sections and directly connected to each other in order to form a gas-tight, sealed metal container enclosing a container interior for receiving the at least one ceramic layer. Subsequently, the metal layers forming the metal container with the at least one ceramic layer received in the container interior are hot isostatically pressed together in a treatment chamber at a gas pressure between 500 and 2000 bar and at a process temperature between 300° C. and the melting temperature of the metal layers for producing a preferably flat connection of at least one of the metal layers and the at least one ceramic layer, and at least the projecting free edge sections, which are con- (Continued)

nected to each other, of the metal layers for forming the first and second metallization are subsequently removed.

12 Claims, 9 Drawing Sheets

(51) Int. Cl.
    *C04B 35/645*     (2006.01)
    *C04B 37/02*     (2006.01)
    *H01L 23/373*     (2006.01)
    *H05K 3/02*     (2006.01)
    *H05K 3/38*     (2006.01)
    *H01L 23/498*     (2006.01)
    *H05K 1/03*     (2006.01)

(52) U.S. Cl.
CPC ........ *C04B 37/026* (2013.01); *H01L 21/4846* (2013.01); *H01L 21/4857* (2013.01); *H01L 23/3735* (2013.01); *H01L 23/49822* (2013.01); *H05K 3/022* (2013.01); *H05K 3/388* (2013.01); *C04B 2237/064* (2013.01); *C04B 2237/068* (2013.01); *C04B 2237/08* (2013.01); *C04B 2237/083* (2013.01); *C04B 2237/121* (2013.01); *C04B 2237/124* (2013.01); *C04B 2237/127* (2013.01); *C04B 2237/343* (2013.01); *C04B 2237/365* (2013.01); *C04B 2237/366* (2013.01); *C04B 2237/368* (2013.01); *C04B 2237/402* (2013.01); *C04B 2237/407* (2013.01); *C04B 2237/54* (2013.01); *C04B 2237/592* (2013.01); *C04B 2237/595* (2013.01); *C04B 2237/704* (2013.01); *C04B 2237/706* (2013.01); *C04B 2237/72* (2013.01); *C04B 2237/84* (2013.01); *C04B 2237/86* (2013.01); *H01L 2924/0002* (2013.01); *H05K 1/0306* (2013.01); *H05K 2203/04* (2013.01)

(56) References Cited

U.S. PATENT DOCUMENTS

| | | | | |
|---|---|---|---|---|
| 4,763,828 | A * | 8/1988 | Fukaya | C04B 37/026 228/124.1 |
| 5,147,086 | A * | 9/1992 | Fujikawa | B22F 3/1258 228/186 |
| 7,159,757 | B2 * | 1/2007 | Takahashi | C04B 37/021 228/122.1 |
| 2004/0016792 | A1 | 1/2004 | Fujii et al. | |
| 2009/0232972 | A1 * | 9/2009 | Schulz-Harder | C04B 35/645 427/99.2 |
| 2012/0107642 | A1 * | 5/2012 | Meyer | B82Y 30/00 428/623 |

FOREIGN PATENT DOCUMENTS

| | | | | |
|---|---|---|---|---|
| JP | S59204291 A | 11/1984 | | |
| JP | S6063479 A | 4/1985 | | |
| JP | H0394378 A | 4/1991 | | |
| JP | 2001212693 A | 8/2001 | | |
| WO | WO2006/005281 A1 | 1/2006 | | |
| WO | WO2012/048071 A1 | 4/2012 | | |
| WO | WO2013/120486 A1 | 8/2013 | | |
| WO | WO-2013120486 A1 * | 8/2013 | | B32B 9/005 |

* cited by examiner

METHOD FOR PRODUCING A METAL-CERAMIC SUBSTRATE

BACKGROUND OF THE INVENTION

The invention relates to a method for producing a metal-ceramic substrate including a first and second metallization and at least one ceramic layer accommodated between the first and second metallization, wherein first and second metal layers and the at least one ceramic layer are stacked superposed in such a way that free edge sections of the first and second metal layers respectively project beyond the edges of the at least one ceramic layer forming projecting free edge sections.

Metal-ceramic substrates in the form of printed circuit boards comprising a ceramic layer and at least one metallization connected to a surface side of the ceramic layer and structured for the formation of strip conductors, contacts, contact faces or terminal faces are known in the most diverse embodiments. Such metal-ceramic substrates are used for example for constructing power semiconductor modules, i.e. are intended for higher operational voltages, namely 600 V and more. One of the requirements on such power semiconductor modules is a sufficiently high partial discharge resistance, wherein metal-ceramic substrates also have to meet this requirement.

Furthermore, the so-called "DCB process" ("Direct-Copper-Bonding") is known for connecting the metallization-forming metal foils or metal layers to one another or to a ceramic substrate or a ceramic layer. Metal layers, preferably copper layers or copper foils, are connected to one another and/or to a ceramic layer, namely using metal or copper sheets or metal or copper foils, which at their surface sides comprise a layer or coat ("fusing layer") of a chemical compound of the metal and a reactive gas, preferably oxygen. In the case of this process described by way of example in US-PS 37 44 120 or in DE-PS 23 19 854, this layer or this coat ("fusing layer") forms a eutectic with a melting temperature below the melting temperature of the metal (e.g. copper), so that by placing the metal or copper foil on the ceramic layer and by heating all the layers, the latter can be connected together, namely by melting of the metal layer or copper layer essentially only in the region of the fusing layer or oxide layer. One such DCB process comprises for example the following process steps:

- oxidation of a copper foil in such a way that a uniform copper oxide layer results;
- placing the copper foil with the uniform copper oxide layer onto the ceramic layer;
- heating of the composite to a process temperature between 1025 to 1083° C., for example to approx. 1071° C.;
- cooling to room temperature.

A drawback of the DCB process consists in the fact that process-related imperfections can arise between the respective copper layer and the ceramic layer. Indeed, these imperfections scarcely impair the thermal properties of a metal-ceramic substrate produced using the DCB process, but an impairment of the partial discharge resistance of the power semiconductor module produced therefrom results.

Furthermore, the so-called active soldering method for connecting metallization—forming metal layers or metal foils, in particular also copper layers or copper foils, to a ceramic material or a ceramic layer is known from documents DE 22 13 115 and EP-A-153 618. With this method, which is also used especially for the production of metal-ceramic substrates, a connection is produced between a metal foil, for example copper foil, and a ceramic substrate, for example an aluminium nitride ceramic, at a temperature between approx. 800-1000° C. using a hard solder, which also contains an active metal in addition to a main component, such as copper, silver and/or gold. This active metal, which is for example at least one element of the group Hf, Ti, Zr, Nb, Ce, produces a connection between the hard solder and the ceramic by chemical reaction, whereas the connection between the hard solder and the metal is a metallic hard solder joint. A drawback, however, is that the required hard solder is very cost-intensive and the structuring of the metallization applied by means of an active soldering method is costly from the process standpoint.

A method of producing a stack comprising a plurality of metal plates for forming a cooler is already shown in EP 1 716 624 B1, wherein a plurality of thin metal plates or metal foils are connected to one another to form a stack, which then form a cooler, in particular a micro-cooler. To prevent the formation of micro-cavities in the transition regions between the metal plates, a post-treatment of the plate stack takes place in a protective gas atmosphere at a high treatment temperature below the jointing temperature and at a high gas pressure in the region between 200 and 2000 bar. This post-treatment is also referred to as hot-isostatic pressing ("HIP process"). The exposure of the plate stack to high gas pressure in the protective gas atmosphere under the stated temperature conditions leads, amongst other things, to the fact that the connection between the plates is for the most part free from micro-cavities, i.e. there are no recesses or holes in the connection region of two metal plates. As a protective gas, use is made here of nitrogen, argon or other inert or noble gases. The treatment temperature is adjusted such that diffusion bonding arises between the adjacent surfaces of the metal plates.

A method for producing a metal-ceramic substrate is known from EP 1 774 841 B1, wherein a copper layer is applied to at least one surface side of a ceramic layer using the DCB process. Here, the metal-ceramic substrate is subjected in a following process step to a gas pressure in the range from 400-2000 bar and is post-treated at a post-treatment temperature in the range between 450 and 1060° C. To prevent imperfections or micro-cavities in the region of the metal-ceramic transition following the DCB process, the substrate is subjected to the described post-treatment in a closed pressure chamber in a protective gas atmosphere, for example an argon atmosphere, by heating to a temperature of approx. 560° C. at a pressure of approx. 1100 bar. The bonding of the copper metallizations to the ceramic layer is thus enhanced and the formation of imperfections markedly reduced.

The aforementioned methods for eliminating imperfections have the drawback of a high process-related outlay, especially since, in the first place, a direct flat jointing connection between the metal layer and the ceramic layer has to be produced by means of a first connection technology and the latter subsequently has to be subjected to a post-treatment in order to eliminate micro-cavities arising in the jointing process.

A method for producing a direct flat connection of a ceramic layer to a metal layer is also already known from U.S. Pat. No. 4,763,828, wherein diffusion bonding in an argon protective gas atmosphere is described using the HIP process.

A multilayer casing material comprising a ceramic layer and a metallic material for nuclear reactors is known from WO 2012/048 071 A1. A tube or a channel is formed from this multilayer casing material. The metallic material forms the "inner" layer of the tube or the channel and brings about hermetic sealing of the latter.

Furthermore, a method for producing an electrical resistance comprising a metal foil connected to a ceramic substrate is known from U.S. Pat. No. 4,325,183, wherein a direct flat connection between the metal foil and the ceramic substrate is produced by means of the HIP process. For this purpose, the arrangement comprising the metal foil and the ceramic substrate is accommodated in a sealed envelope, wherein the envelope lies adjacent in a tight manner and has previously been evacuated.

SUMMARY OF THE INVENTION

Based on the aforementioned art, the subject of the invention is to provide a method for producing a metal-ceramic substrate, which enables a cavity-free or microcavity-free flat and direct connection between the ceramic layer and the metal layer, said method being able to be implemented by means of few process steps and in a manner that spares resources.

The main aspect of the method according to the invention is to be seen in the fact that the first and second metal layer and the ceramic layer are stacked superposed, namely in such a way that the free edge sections of the first and second metal layer respectively project beyond the edges of the ceramic layer, that the first and second metal layers are deformed towards each other in the region of the projecting free edge sections and directly connected to each other in order to form a gas-tight, sealed metal container enclosing a container interior for accommodating the ceramic layer, that the metal layers forming the metal container with the ceramic layer accommodated in the container interior are hot isostatically pressed together in a treatment chamber at a gas pressure between 500 and 2000 bar and at a process temperature between 300° C. and the melting temperature of the metal layers to produce a connection, wherein at least the projecting free edge sections of the metal layer which are connected to each other are removed for forming the first and second metallizations. The metal layers overlapping at the edges are particularly preferably used for the gas-tight encapsulation of the ceramic layer for the subsequent HIP process. A particularly efficient and resource-saving method for the direct flat connection of a metal layer to a ceramic layer thus results, and moreover free from disruptive cavities or micro-cavities. Furthermore, when use is made of the HIP process, as compared to the DCB process, thinner metal layers can advantageously be processed and applied onto a ceramic layer. The minimum thickness of the metal layers that can be processed by means of the DCB process amounts to approx. 200 micrometer, whereas metal layers with a layer thickness of approx. 50 micrometer and over can be applied to the ceramic layer when use is made of the HIP process. Furthermore, the grain sizes in the HIP process can also be advantageously adjusted, in contrast with the DCB process.

According to an advantageous embodiment of the method according to the invention, the free edge sections of the metal layers are deformed before their direct connection by applying a clamping force to form the metal container and the free edge sections of the metal layers are then joined together at the edges by welding, in particular contact welding or laser welding, or by soldering, also hard soldering. Alternatively, the direct connection of the metal layers at the edges can be produced by means of a mechanical-connection and/or processing method, and more precisely by rolling, pressing and/or flanging of the free edge sections.

The container interior is particularly advantageously evacuated before the direct connection of the metal layers at the edges, wherein oxygen can also be introduced into the evacuated container interior before the direct connection of the metal layers at the edges. An optimum atmosphere for the HIP process is formed by the evacuation and introduction of oxygen, in particular an oxide layer arises on the ceramic layer and/or the metal layer, by means of which the adhesiveness of the diffusion bonding is further increased.

The metal layers are also advantageously connected directly to one another at the edges in a vacuum or in an inert gas atmosphere, preferably using nitrogen or argon as an inert gas.

According to an advantageous variant of embodiment, a porous material, in particular a porous auxiliary ceramic layer, is introduced into the container interior in addition to the ceramic layer, said auxiliary ceramic layer being designed for absorbing a residual gas present in the container interior. Inclusions produced by performing the HIP process due to residual gas that is present can thus be prevented. The porous material is preferably evacuated before introduction into the container interior and coated with a gas-tight sealing layer. The porous material can also be charged with oxygen before introduction in the container interior and coated with a gas-tight sealing layer.

Before the stacking, the ceramic layer can also be completely coated at its upper and/or lower side with a hard solder layer or an active solder layer, as a result of which additional hard soldering of the metal layer and the ceramic layer is possible with a reduced quantity of solder.

Furthermore, the subject-matter of the present invention is an alternative method for producing a metal-ceramic substrate comprising a first and second metallization and at least one ceramic layer with an upper and lower side accommodated between the first and second metallization, wherein a peripheral, frame-like, preferably continuous solder layer is deposited at the edges on the upper and lower side of the ceramic layer, wherein a first and second metal layer and the ceramic layer are stacked superposed and a solder joint is produced at the edges by heating at least in the region of the peripheral, frame-like solder layer, namely such that a gas-tight sealed, gap-like intermediate space arises between the ceramic layer and the respective metal layer, wherein the metal layers and the ceramic layer are pressed together hot isostatically in a treatment chamber at a gas pressure between 500 and 2000 bar and a process temperature between 300° C. and the melting temperature of the metal layers or of the solder layer and wherein at least the edge regions of the metal layers connected to the ceramic layer by the peripheral, frame-like solder joint are removed for forming the first and second metallization.

Preferably, at least the edge regions of the metal layers connected to the ceramic layer by means of the solder joint at the edges are removed for forming the first and second metallization.

In a variant of embodiment of the two methods, one of the metal layers, before the hot isostatic pressing, is connected to the ceramic layer using a direct copper bonding process or a hard soldering or active soldering method. In particular, it may be desirable to form only one of the metallizations with a layer thickness from 50 micrometer, whereas a metallization with a layer thickness from 200 micrometer produced according to known connection methods is sufficient for the opposite further metallization, for example for connecting a cooling arrangement.

Furthermore, at least one further metal layer, preferably of copper or aluminium, can advantageously be introduced between the first metal layer and the ceramic layer and/or between the second metal layer and the ceramic layer during the stacking. A first metal layer of copper and a further metal layer of aluminium are preferably provided, which are either loosely stacked superposed or directly connected to one another, for example welded or roll-bonded to one another. The further metal layer can have different dimensions from the dimensions of the ceramic layer, for example can be accommodated inside the edge region of the ceramic layer or run flush with the latter or extend over the edge region of the ceramic layer, but at most to an extent such that the first and further ceramic layer have a flush edge profile.

Furthermore, the layers are advantageously clamped against one another by means of an auxiliary tool comprising two, preferably mutually opposite half-shells for the connection of the metal layers at the edges.

According to a preferred variant of embodiment of the method according to the invention, at least one of the metal layers and/or the upper and/or lower side of the ceramic layer is provided with an oxide layer before the stacking. For example, the surface of the metal layers provided for the connection can be oxidised or the ceramic layer can undergo a preliminary treatment and thermal oxidation.

The expressions "approximately", "essentially" or "roughly", within the meaning of the invention, signify deviations from the exact value of +/−10%, preferably of +/−5% and/or deviations in the form of changes which are unimportant for the function.

Developments, advantages and possible applications of the invention also emerge from the following description of examples of embodiment and from the drawings. All the described and/or figuratively illustrated features in themselves or in any combination are in principle the subject-matter of the invention, irrespective of their combination in the claims or their back-reference. The content of the claims also forms a component part of the description.

BRIEF DESCRIPTION OF THE DRAWINGS

The invention is explained in greater detail below with the aid of the figures using examples of embodiment. In the figures.

DETAILED DESCRIPTION OF THE INVENTION

Figure 1:
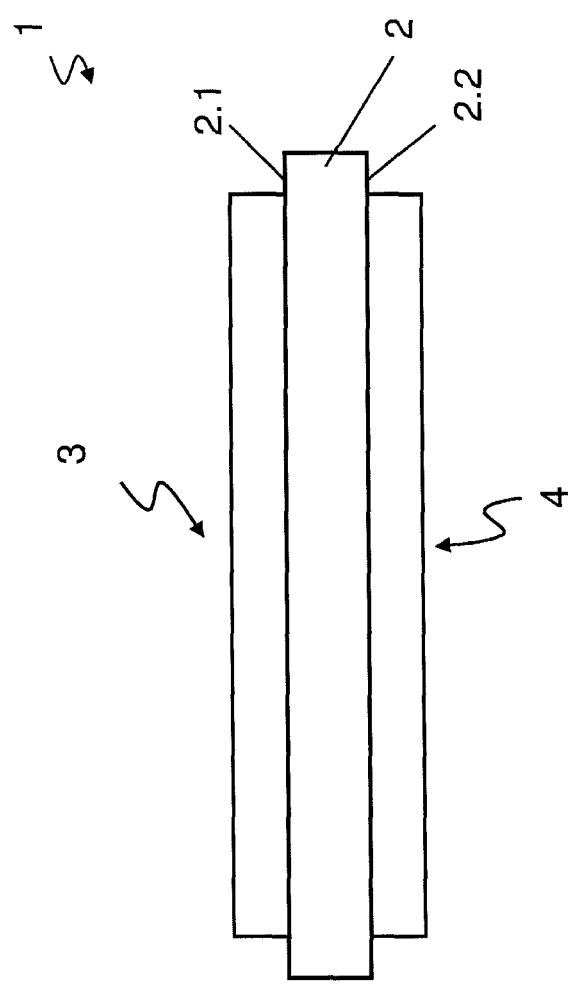
FIG. 1 shows a simplified schematic cross-sectional representation through a metal-ceramic substrate.

FIG. 1 shows, in a simplified schematic representation, a cross-section through a standard embodiment of a metal-ceramic substrate 1 comprising a ceramic layer 2 with an upper side 2.1 and a lower side 2.2, which are provided respectively with a metallization 3, 4, namely the upper side 2.1 comprises a first metallization 3 and the lower side 2.2 a second metallization 4.

Metallizations 3, 4 can be produced from the same or different metal(s) and can be constituted structured for the formation of contact surfaces and/or an electronic circuit. First and second metallizations 3, 4 are preferably connected directly and flat with the upper and lower side 2.1, 2.2, respectively.

First and second metallizations 3, 4 are produced for example from copper or a copper alloy or aluminium or an aluminium alloy. The layer thickness of the first and second metallizations 3, 4 amounts to at least 20 micrometer, preferably between 20 and 900 micrometer, wherein layer thicknesses between 150 and 600 micrometer preferably being used in the area of microelectronics and layer thicknesses between 50 and 150 micrometer preferably being used in the LED area. It goes without saying that other suitable metals can also be used to produce metallizations 3, 4.

Ceramic layer 2 is produced for example from an oxide, nitride or carbide ceramic such as aluminium oxide ($Al_2O_3$) or aluminium nitride (AlN) or silicon nitride ($Si_3N_4$) or silicon carbide (SiC) or from aluminium oxide with zirconium oxide ($Al_2O_3+ZrO_2$) and has a layer thickness for example between 50 micrometer and 1000 micrometer, preferably between 200 micrometer and 700 micrometer.

This is where the invention comes in and proposes an efficient method for producing a metal-ceramic substrate 1 comprising such first and second metallizations 3, 4 and at least one ceramic layer 2 accommodated between first and second metallizations 3, 4. According to the invention, the direct flat connection between respective metallizations 3, 4 and ceramic layer 2 is produced by using a pressure-induced connection process, and more precisely the hot-isostatic pressing process (HIP process), in order to effectively prevent the emergence of cavities or micro-cavities in the connection region between respective metallizations 3, 4 and ceramic layer 2. Much thinner metal layers 5, 6 can also be processed by means of the hot-isostatic pressing process as compared to the DCB process, for example even from a minimum layer thickness of approx. 50 micrometer.

The basic mode of operation of the hot-isostatic pressing process or the so-called HIP method or HIP process is known. The pressure preferably applied in a two-dimensionally extending manner to the layers to be connected can be generated mechanically and/or by means of a gas or fluid. The layer thickness can advantageously be reduced with the use of the HIP process for producing a preferably flat connection between metallizations 3, 4 and ceramic layer 2 as compared to the other connection methods, in particular metal layers having a thickness of 50 micrometer and over can be processed.

For the pressure-induced flat connection of first and second metallizations 3, 4 to ceramic layer 2, first and second metal layers 5, 6 are the first provided, which are stacked superposed together with ceramic layer 2, and more precisely such that ceramic layer 2 is accommodated between metal layers 5, 6. The layer sequence of metal-ceramic substrate 1 represented in FIG. 1 is thus already present, wherein first and second metal layers 5, 6 and ceramic layer 2 do not yet have a flat connection.

First and second metal layers 5, 6 are adapted in terms of their cross-sectional shape essentially to the cross-sectional shape of ceramic layer 2. Ceramic layer 2 preferably has a rectangular or square cross-sectional shape. Alternatively, however, ceramic layer 2 can also have a round, oval or an otherwise polygonal cross-sectional shape.

First and second metal layers 5, 6 overlap with their free edge sections 5a, 6a free edge 2' of ceramic layer 2, namely over the entire course of free edge 2' of ceramic layer 2. First and second metal layers 5, 6 thus project outwards with their free edge sections 5a, 6a from free edge 2a of ceramic layer 2, and for example over a length L of between 3 mm and 30 mm. Length L is selected here depending on the layer thickness of first and second metal layers 5, 6.

Figure 2:
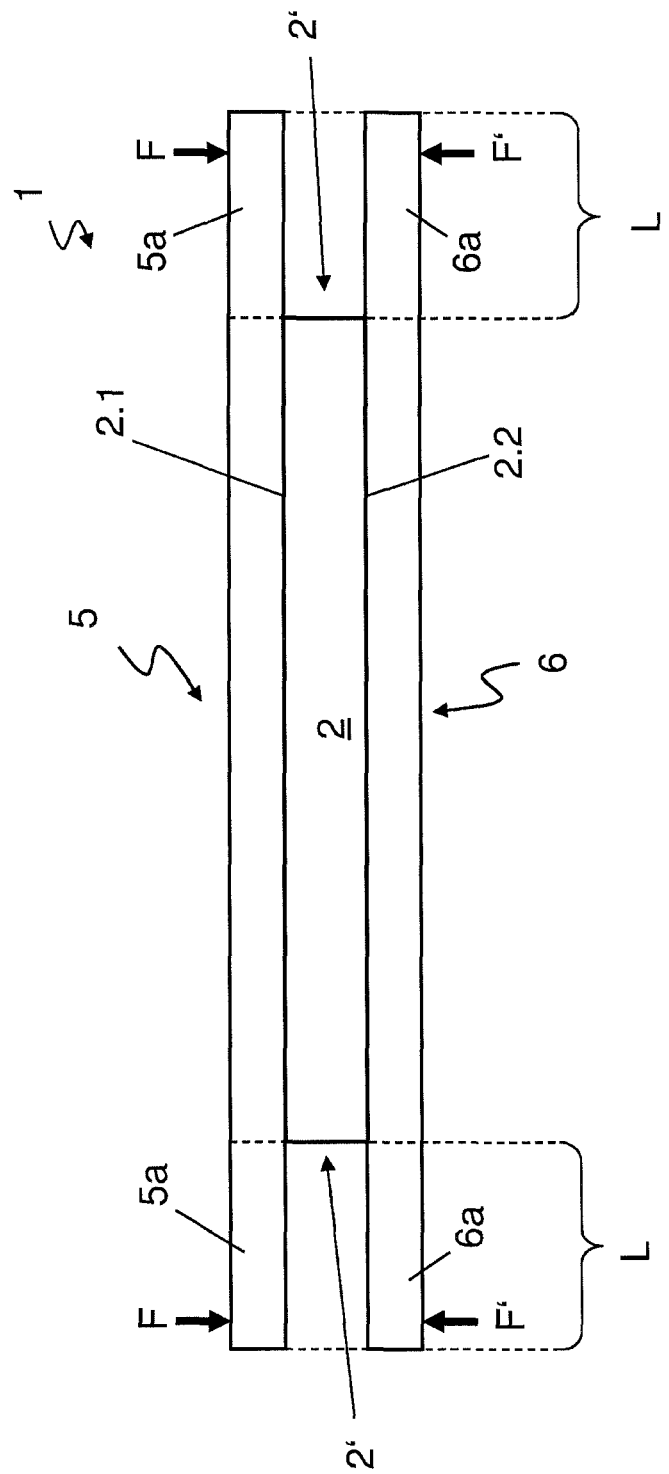
FIG. 2 shows a simplified cross-sectional representation through a stack comprising first and second metal layers and a ceramic layer accommodated in between, FIG. 3 shows a schematic cross-sectional representation through a metal container formed from the stack according to FIG. 2 with a ceramic layer accommodated in the container interior.

In the present example of embodiment, a stack comprising first and second metal layers 5, 6 and ceramic layer 2 is formed according to FIG. 2, wherein ceramic layer 2 lies flat on second metal layer 6 and first metal layer 5 then follows on the latter, i.e. ceramic layer 2 is accommodated between first and second metal layers 5, 6 in the stack and free edge sections 5a, 6a of the first and second metal layers 5, 6 project beyond ceramic layer 2 at the edges.

According to the invention, a gas-tight sealed metal container 7 with a container interior 8 is formed from first and second metal layers 5, 6, in which container interior ceramic layer 2 is completely accommodated. In this regard, first and second metal layers 5, 6 are deformed towards one another in the region of projecting free edge sections 5a, 6a, and more precisely by applying lateral clamping forces F, F' preferably acting perpendicular to the surface of metal layers 5, 6, which clamping forces are orientated respectively in the direction of upper and lower sides 2.1, 2.2 of ceramic layer 2. The flat sections of first and second metal layers 5, 6 directly adjacent to ceramic layer 2 preferably run parallel to upper side and lower sides 2.1, 2.2 of ceramic layer 2. Metal container 7 thus essentially comprises two half-shell shaped halves 7.1, 7.2, which are formed by first and second deformed metal layers 5, 6.

In the present example of embodiment, free edge sections 5a of first metal layer 5 are acted upon by a clamping force F acting vertically downwards i.e. in the direction of ceramic layer 2, and free edge sections 6a of second metal layer 6 are acted upon by a clamping force F' acting vertically upwards, i.e. in the direction of ceramic layer 2, and are thus clamped together and a corresponding deformation of metal layers 5, 6 in their free edge sections 5a, 6a is thus achieved. Correspondingly deformed free edge sections 5a, 6a are connected directly together, and more precisely along a peripheral, i.e. annular, connection region VB. Free edge sections 5a, 6a preferably produce a gas-tight sealed edge of metal container 7 running flush. Metal container 7 thus forms an encapsulation of ceramic layer 2 by means of container halves 7.1, 7.2 constituted half-shell shaped and connected together gas-tight.

The direct connection of deformed free edge sections 5a, 6a at the edges in annular connection region VB preferably takes place by welding, in particular by contact welding or laser welding or by soldering, also hard soldering. Alternatively, the direct connection at the edges can also be produced by means of a mechanical-connection and/or processing method, and more precisely by rolling, pressing and/or flanging of free edge sections 5a, 6a, wherein a gas-tight mechanical connection at the edges between the two metal layers 5, 6 also arises here along annular connection region VB. With a connection by means of laser welding, free edge sections 5a, 6a are preferably welded to one another at the outer edges, and preferably at an angle between 45° and 90°. In a variant of embodiment, the direct connection at the edges takes place in an atmosphere advantageous for the connection process, for example in a vacuum, in an air atmosphere or in an inert gas atmosphere using, for example, nitrogen or argon as an inert gas.

Figure 3:
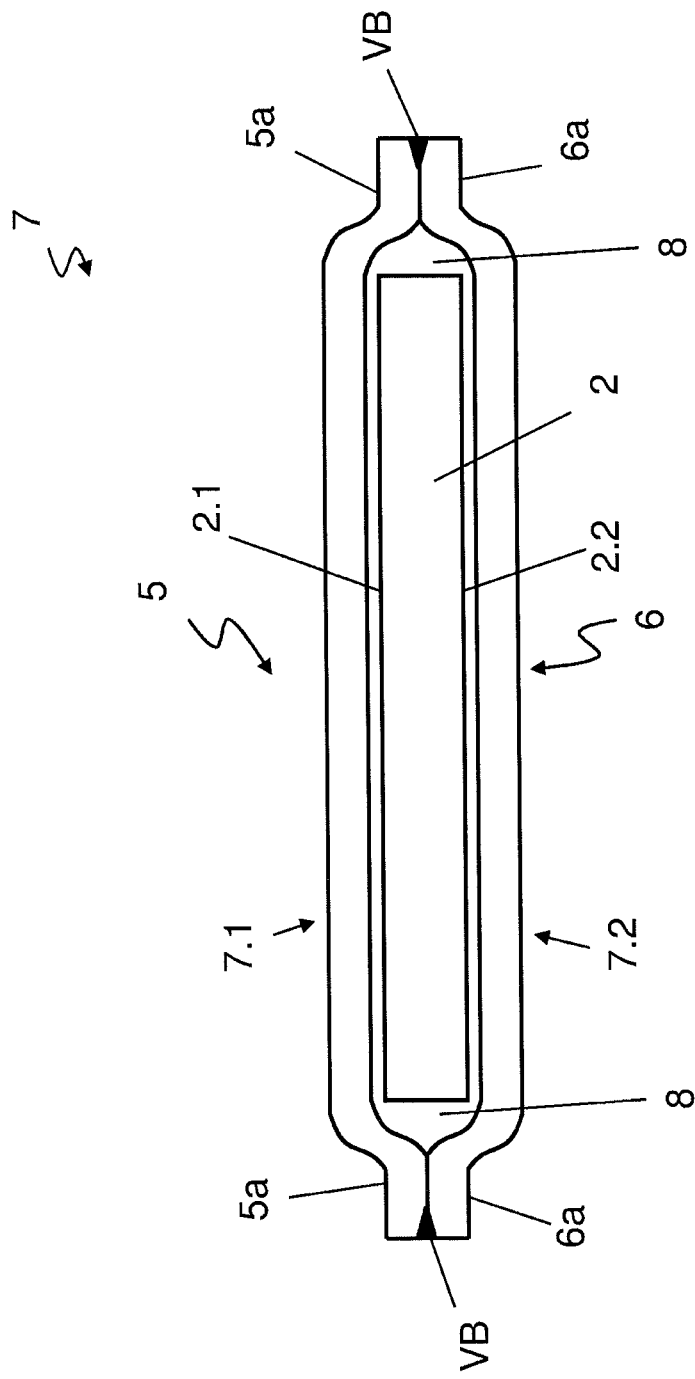
Figure 4:
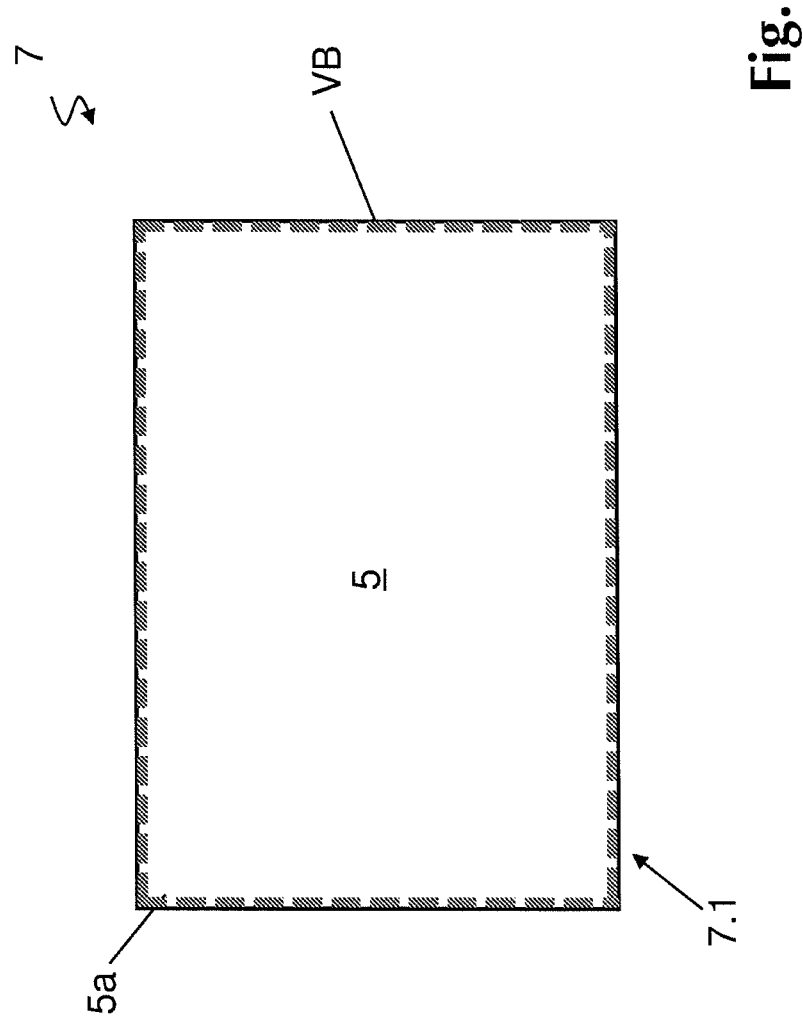
FIG. 4 shows a schematic plan view of the metal container according to FIG. 3.

FIG. 3 shows by way of example a schematic cross-section through metal container 7 with ceramic layer 2 accommodated in container interior 8, from which the half-shell shaped embodiment of the container halves can also be seen. FIG. 4 shows by way of example a plan view of metal container 7 and the course of annular connection region VB indicated by a dashed line.

Metal layers 5, 6 forming metal container 1 with ceramic layer 2 accommodated in container interior 8 are then pressed together hot-isotatically in a treatment chamber (not represented in the figures) at a gas pressure between 500 and 2000 bar and a process temperature between 300° C. and the melting temperature of metal layers 5, 6. A diffusion bond is thus produced between upper side 2.1 of ceramic layer 2 and the section of the first metal layer 5 in direct connection with the latter and between lower side 2.2 of ceramic layer 2 and the section of second metal layer 6 in direct connection with the latter, said diffusion bond comprising no cavities or micro-cavities and having a high adhesive strength.

Figure 6:
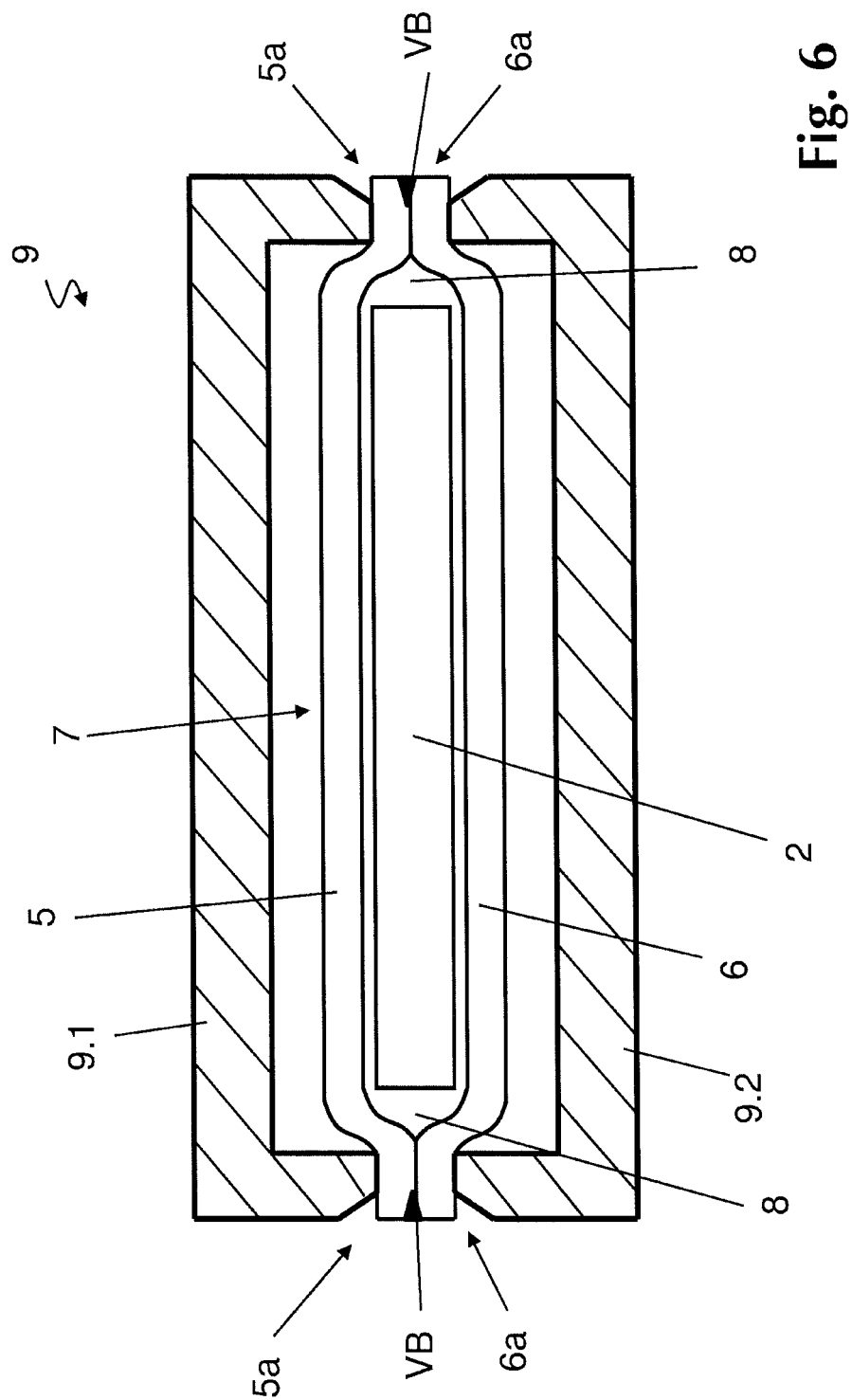
FIG. 6 shows a simplified schematic cross-sectional representation through the metal container according to FIG. 3 accommodated in an auxiliary tool.

Metal container 1 is subjected to a clamping force F, F' and thus clamped in the region of free edge sections 5a, 6a, preferably along annular connection region VB, by means of an auxiliary tool 9 with for example two half shells 9.1, 9.2. This simplifies the production of a direct connection at the edges between free edge sections 5a, 6a, in particular of a laser welding connection. A working medium such as oxygen or suchlike can thus also be introduced into container interior 8, without the latter already being permanently sealed. FIG. 6 shows by way of example a cross-section through metal container 1 accommodated in auxiliary tool 9.

After the hot-isostatic pressing, at least in sections, of metal layers 5, 6 or container halves 7.1, 7.2 with ceramic layer 2, free edge sections 5a, 6a are removed, preferably by a mechanical processing method or a suitable etching process. The remaining sections of first and second metal layers 5, 6 connected to upper and lower sides 2.1, 2.2 of ceramic layer 2 form first and second metallizations 3, 4 of metal-ceramic substrate 1.

In a variant of embodiment, the subjecting of metal layers 5, 6 to clamping force F, F' and the subsequent connection at the edges of free edge sections 5a, 6a takes place in the ambient atmosphere, i.e. even after the sealing of metal container 7 forming an encapsulation of ceramic layer 2, there is still at least residual air or a residual gas present in container interior 8. Due to the residual air or the residual gas, however, inclusions can arise in the connection region between metal layers 5, 6 and ceramic layer 2 when the HIP process is carried out.

In a variant of embodiment, metal layers 5, 6 and ceramic layer 2 are first stacked and clamped under an air atmosphere, for example by means of auxiliary tool 9, and are then directly connected to one another at the edges.

According to a further variant of embodiment, the container interior 8 is evacuated and therefore the residual air present in container interior 8 or the residual gas present therein is preferably completely removed before the direct connection of free edge sections 5a, 6a of metal layers 5, 6 at the edges in order to prevent inclusions.

Furthermore, the adhesive strength of the pressure-induced direct connection can be increased by producing an oxide layer on upper or lower sides 2.1, 2.2 during the HIP process. The oxygen proportion in the ambient atmosphere, however, is often too small for a suitable oxide layer to form on metal layers 5, 6 and/or ceramic layer 2. Such an oxide layer preferably comprises copper doping.

In order to assist the formation of a suitable oxide layer, oxygen can be fed to the production process, and more precisely metal layers 5, 6 can already be exposed to oxygen during the forming of the stack.

Alternatively or in addition, oxygen can be introduced into container interior 8 before the connection of metal layers 5, 6 at the edges and metal layers 5, 6 can be pretreated with oxygen. Such flooding of container interior 8 with oxygen takes place for example before the edge clamping of metal layers 5, 6 or after the evacuation of container interior 8.

The formation of an oxide layer can also be effectively assisted by a preliminary treatment of ceramic layer 2, and for example by applying an auxiliary layer by means of a mechanical-chemical process. In this mechanical-chemical process, a layer of copper, copper oxide or other copper-containing compounds is deposited on at least one side 2.1, 2.2 of ceramic layer 2, in particular an AlN substrate to produce the auxiliary layer. The deposition of this auxiliary layer can be carried out using alternative methods. Copper, copper oxide or other copper-containing compounds can be deposited for example by means of sputtering processes, currentless deposition of copper with a standard bath, vapour deposition, screen-printing, immersion in solutions etc. Ceramic layer 2, in particular the AlN substrate, then undergoes an oxidation process by means of which copper, copper oxide or other copper compounds are oxidised.

In particular, when use is made of an aluminium nitride ceramic layer 2 for producing metal-ceramic substrate 1, the mechanical interlocking of mutually opposite layers 2, 5, 6 arising in the performance of the HIP pressing process already has sufficient adhesive strength, i.e. additional production of an intermediate layer is not necessary, since an oxide layer that is sufficient to create a connection forms by itself on the surface of aluminium nitride ceramic layer 2 on account of the ambient oxygen.

When use is made of a silicon nitride ceramic layer 2, a preliminary treatment to produce an intermediate layer is likewise not necessary. The ambient oxygen or the residual oxygen in the container interior is sufficient to allow the formation of a silicon dioxide layer advantageous for the connection process.

In order to promote the formation of a natural oxide layer on the ceramic surface, metal layers 5, 6 to be connected to ceramic layer 2 can be enriched with oxygen. This oxygen can be released by the enriched metal layers 5, 6 during the HIP pressing process.

In a variant of embodiment, rinsing of container interior 8 after the clamping is conceivable with an inert gas, for example oxygen or argon.

In an alternative variant of embodiment, a porous material 11, for example metal or ceramic, can be accommodated in container interior 8 in addition to ceramic layer 2 in order to absorb the residual air or the residual gas present in container interior 8, said porous material forming an absorption reservoir for the residual gas present in container interior 8 during the performance of the HIP process. An atmosphere advantageous for performing the HIP process is created by means of porous material 11.

Porous material 11 is preferably evacuated before introduction into container interior 8. In a variant of embodiment, porous material 11 is provided with a gas-tight sealing layer 12 before introduction into container interior 8, porous materials 11 without a gas-tight sealing layer 12 also being able to be used. In the performance of the HIP process, gas-tight sealing layer 12 is split open and the residual gas present in container interior 8 is absorbed in a targeted manner by evacuated porous auxiliary ceramic layer 11.

Figure 5:
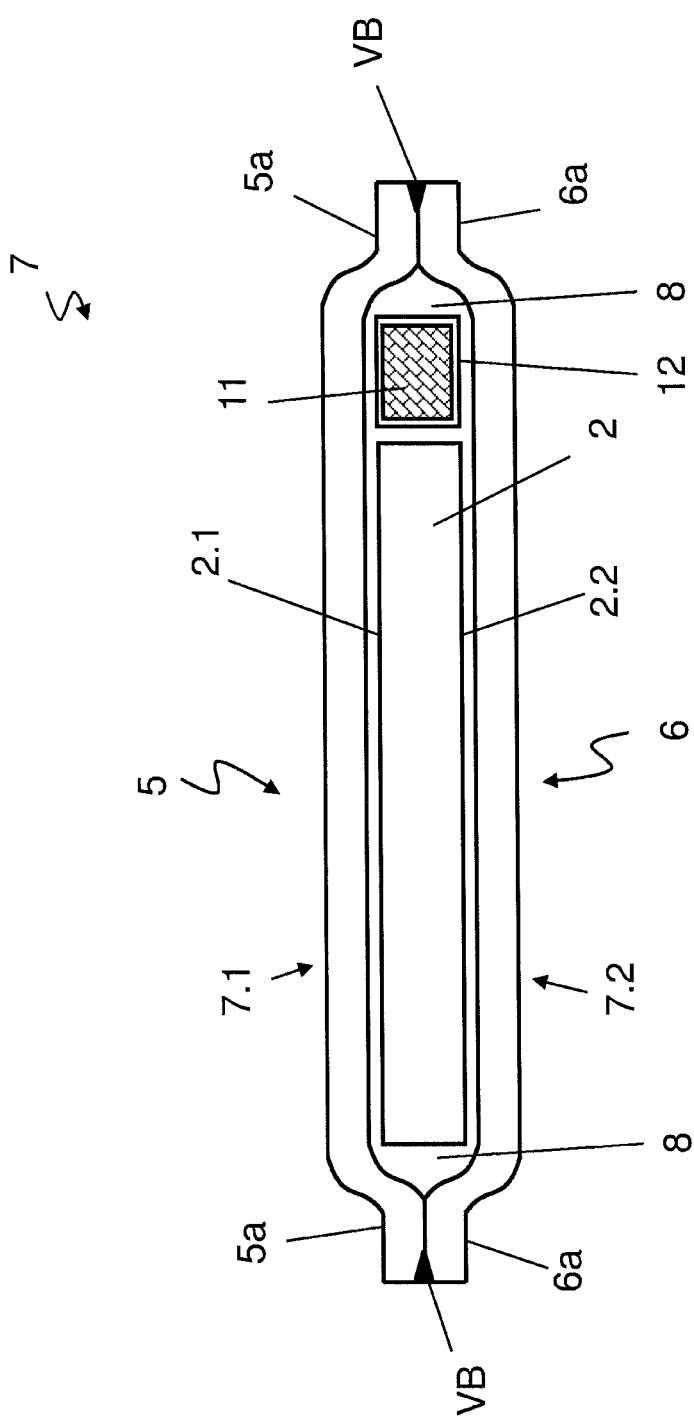
FIG. 5 shows a schematic cross-sectional representation through a metal container with a ceramic layer accommodated in the container interior and an additional porous auxiliary ceramic layer.

Alternatively or in addition, porous material 11, in particular prior to the application of a gas-tight sealing layer 12, can be charged with oxygen in an oxygen atmosphere. Gas-tight sealing layer 12 in each case forms a gas-tight casing of porous material 11. FIG. 5 shows by way of example a cross-section through a metal container 7 according to FIG. 3, in which at least one porous auxiliary ceramic layer 11 with a gas-tight sealing layer 12 is accommodated in addition to ceramic layer 2. It goes without saying that a plurality of layers of such porous materials 11 can also be provided in a different form and arrangement inside metal container 7.

Porous material 11 can also be provided for example with a copper oxide layer. Such a CuO layer is converted in the HIP process into oxygen and $Cu_2O$. The oxygen hereby liberated contributes to the oxidation of metal layers 5, 6 and of ceramic layer 2. Apart from CuO, use can also be made of other oxides which, under the process parameters of the HIP process, in particular temperature and pressure, liberate oxygen and promote the formation of an oxide layer, and more precisely for example MnO, VO, TiO and $Mo_3O$.

In a further variant of embodiment, first metal layer 5 is produced from copper or a copper alloy and second metal layer 6 is produced from aluminium or an aluminium alloy.

Also, for example, a further metal layer 5' of aluminium can be provided between ceramic layer 2 and a first metal layer 5 of copper, which are also stacked superposed. Analogous hereto, a further metal layer 6' can also be accommodated between second metal layer 6 and ceramic layer 2. First and second metal layers 5, 6 and respectively further metal layers 5', 6' are preferably connected together by means of roll bonding.

Figure 9:
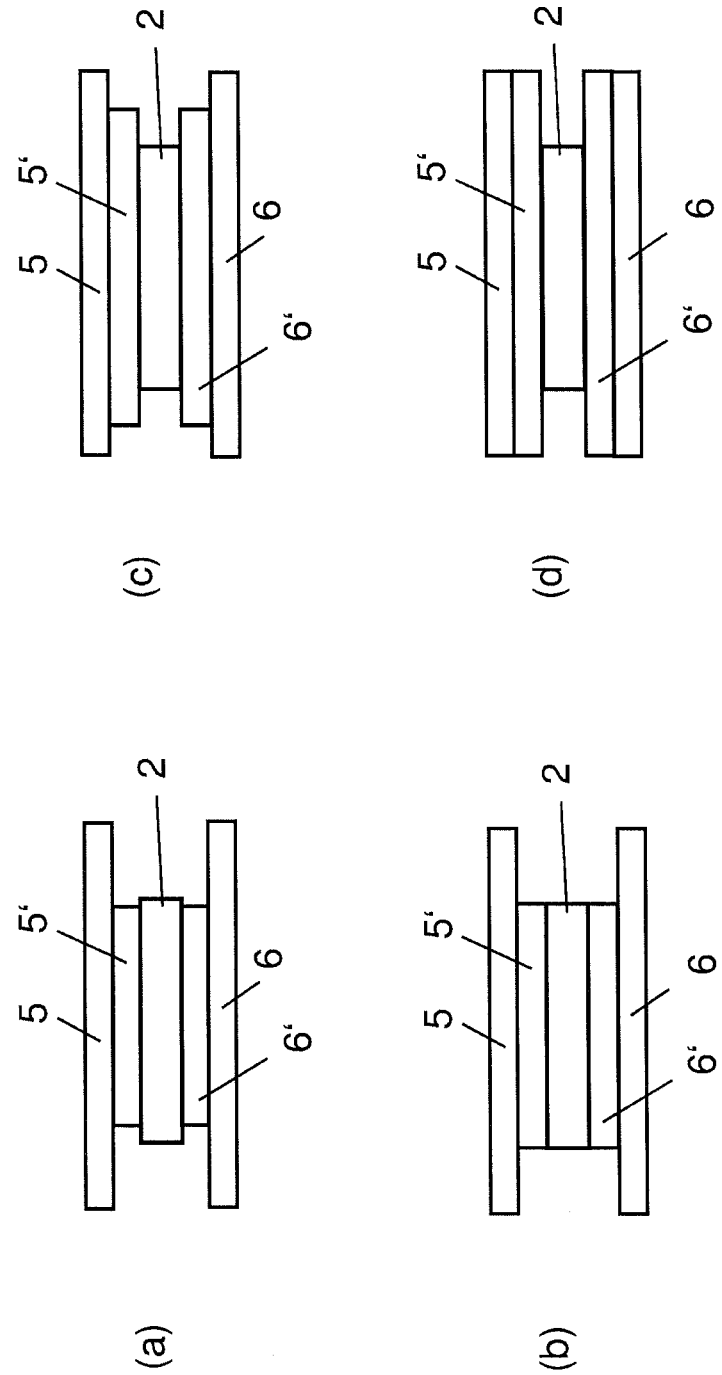

FIG. 9 shows by way of example different variants of embodiment (a) to (d) of a metal-ceramic substrate 1 with a first metal layer 5 of copper and a further metal layer 5' of aluminium and as well as a second metal layer 6 of copper and a further metal layer 6' of aluminium, which are connected together by means of the method according to the invention. In variant of embodiment (c), metal layers 5, 6, 5', 6' are loosely stacked superposed, whereas in variant of embodiment (d) a connection exists between the upper and lower two metal layers 5, 5' and respectively 6, 6'. The connection can be produced either by roll bonding of the copper layers and aluminium layers 5, 5' and 6, 6' or by welding at the edges. In variant of embodiment (a), further metal layers 5', 6' extend only partially over upper and lower sides 2.1, 2.2 of the ceramic layer, i.e. it is arranged offset inwards at the edge. Variant of embodiment (b) shows a flush edge course of further metal layers 5', 6' with ceramic layer 2 and according to variant of embodiment (c) further metal layers 5', 6' extend over free edge 2' of ceramic layer 2, but inside the edge of first and second metal layers 5, 6. In variant of embodiment (d), first metal layer 5 and assigned further metal layer 5' and/or second metal layer 6 and further metal layer 6' each have a flush edge course, i.e. they are constituted identical to one another with regard to shape. Furthermore, it is possible to provide a different layer structure on upper and lower sides 2.1, 2.2 of ceramic layer 2 or to provide a combination of variants of embodiment (a) to (d) represented in FIG. 9.

Furthermore, ceramic layer 2 or its upper and/or lower sides 2.1, 2.2 can be coated over its entire area with a hard solder layer before the method according to the invention is carried out. The soldering process is, as it were, thus integrated into the HIP process. The layer thickness of the hard solder layer can be advantageously reduced here compared to the known active soldering method, i.e. a smaller quantity of solder is advantageously required, because as a result of the HIP process metal layers 5, 6 are also pressed into unevennesses of upper and/or lower sides 2.1, 2.2.

Figure 7:
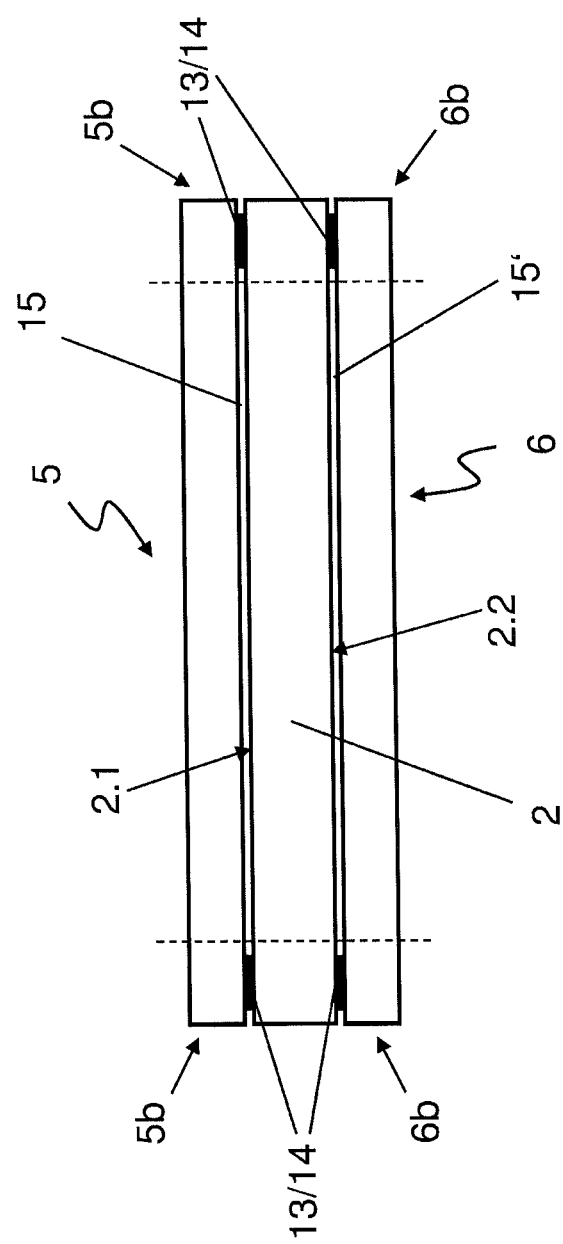
FIG. 7 shows a simplified schematic cross-sectional representation through a stack comprising first and second metal layers and a ceramic layer accommodated in between, which are connected at the edges by a peripheral, frame-like solder joint.
Figure 8:
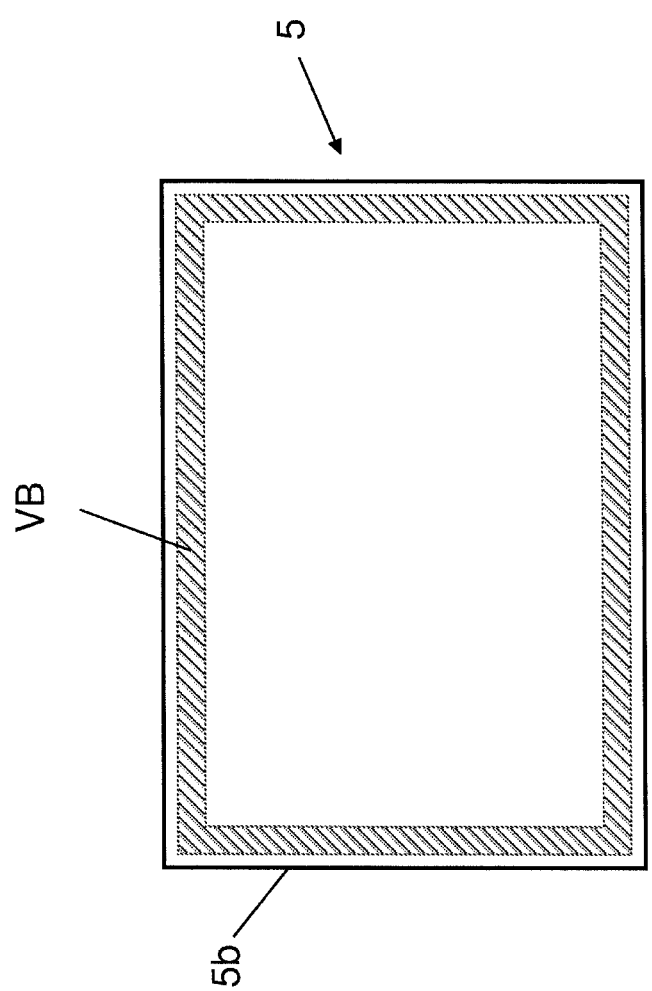
FIG. 8 shows a schematic plan view of the stack according to FIG. 6, and FIGS. 9a-d show several variants of embodiment of a stack comprising four metal layers and a ceramic layer for producing a metal-ceramic substrate according to the method according to the invention.

FIGS. 7 to 8 describe a method for producing a metal-ceramic substrate 1, this method being an alternative method for encapsulating ceramic layer 2 in a metal container 7. According to this method, ceramic layer 2 is provided at the edges with a peripheral, frame-like solder layer 13 at upper and lower sides 2.1, 2.2 and a stack comprising first and second metal layers 5, 6 and ceramic layer 2 is then formed.

In a subsequent step, the stack is heated in such a way that the prepared peripheral, frame-like solder layer 13 leads to a solder joint 14 at the edges between respective metal layers 5, 6 and ceramic layer 2. As a result of the heating and the previous evacuation of gap-like intermediate spaces 15, 15' between respective metal layers 5, 6 and ceramic layer 2, an advantageous atmosphere is present for performing the hot-isostatic process or HIP process.

Solder joint 14 at the edges also forms a preferably annular connection region VB'. Finally, the stack comprising first and second metal layers 5, 6 and ceramic layer 2 and formed by solder joint 14 at the edges is in turn introduced into a treatment chamber (not represented) and, at a gas pressure between 500 and 2000 bar and a process temperature between 300° C. and the melting temperature of metal layers 5, 6 or of solder layer 13, said metal layers are hot-isostatically pressed with ceramic layer 2. The sections of respective metal layers 5, 6 connected in a two-dimensionally extending manner to ceramic layer 2 form metallizations 3, 4 of metal-ceramic substrate 1.

Edge sections 5b, 6b of metal layers 5, 6 connected by means of ceramic layer 2 via solder joint 14 at the edges are removed to delimit first and second metallizations 3, 4, and more precisely by means of a mechanical processing method or by means of a laser or a suitable etching process. The remaining sections of first and second metal layers 5, 6 thus form first and second metallizations 3, 4 of metal-ceramic substrate 1.

Peripheral, frame-like solder layer 13 is for example constituted continuous, and preferably in the form of a closed ring. FIG. 8 shows by way of example the course of peripheral, frame-like solder layer 13 deposited on upper side 2.1 of ceramic layer 2.

In a variant of embodiment of the two methods, one of the metal layers is connected to the ceramic layer, prior to the hot-isostatic pressing, by using a direct copper bonding process or a hot soldering or active soldering method. Metallizations with a different layer thickness from 50 micrometer can thus be produced.

The invention has been described above on the basis of examples of embodiment. It goes without saying that numerous changes and modifications are possible without thereby departing from the inventive idea underlying the invention.

LIST OF REFERENCE NUMBERS 1 metal-ceramic substrate
2 ceramic layer
2' free edge
2.1 upper side
2.2 lower side
3 first metallization
4 second metallization
5 first metal layer
5' further metal layer
5a free edge section
5b edge region
6 second metal layer
6' further metal layer
6a free edge section
6b edge region
7 metal container
7.1, 7.2 container halves
8 container interior
9 auxiliary tool
9.1, 9.2 half-shells
11 porous material
12 gas-tight sealing layer
13 peripheral, frame-like solder layer
14 soldering joint at edges
15, 15' gap-like intermediate space
VB, VB' annular connection region
F, F' clamping forces

The invention claimed is:

1. A method for producing a metal-ceramic substrate, the method comprising:
    deforming a region of projecting free edge sections of a metal-ceramic stack, wherein the metal-ceramic stack comprises first and second metal layers and at least one ceramic layer accommodated between the first and second metal layers, wherein first and second metal layers and the at least one ceramic layer are stacked superposed in such a way that free edge sections of the first and second metal layers respectively project beyond the edges of the at least one ceramic layer forming projecting free edge sections;
    wherein the deforming comprises applying a clamping force to deform the projecting free edge sections before their direct connection and deforming the projecting free edge sections such that the projecting free edge sections are directly connected to each other in order to form a gas tight, sealed metal container enclosing a container interior for accommodating the at least one ceramic layer;
    hot isostatically pressing together the first and second metal layers in a treatment chamber at a gas pressure between 500 and 2000 bar and at a process temperature between 300° C. and a melting temperature of the first and second metal layers in order to produce a direct connection of the first and second metal layers and the at least one ceramic layer; and
    removing at least the projecting free edge sections of the first and second metal layers which are connected to each other via the direct connection to form the metal-ceramic substrate.

2. The method according to claim 1, wherein the projecting free edge sections of the first and second metal layers are connected together at edges of the first and second metal layers by welding, contact welding, laser welding, soldering, or by hard soldering, or the direct connection of the first and second metal layers at the edges of the first and second metal layers is produced by a mechanical-connection, by rolling, pressing and/or flanging of the free edge sections.

3. The method according to claim 1, wherein a volume in between the first and second metal layers and the at least one ceramic layer is evacuated before the direct connection of the edges of the first and second metal layers is produced.

4. The method according to claim 3, wherein oxygen is introduced into the evacuated volume before the direct connection of the edges of the first and second metal layers.

5. The method according to claim 3, wherein the first and second metal layers are connected directly to one another at the edges of the first and second metal layers in a vacuum or in an inert gas atmosphere, using nitrogen or argon as the inert gas.

6. A method for producing a metal-ceramic substrate, the method comprising:
   deforming a region of projecting free edge sections of a metal-ceramic stack, wherein the metal-ceramic stack comprises first and second metal layers and at least one ceramic layer accommodated between the first and second metal layers, wherein first and second metal layers and the at least one ceramic layer are stacked superposed in such a way that free edge sections of the first and second metal layers respectively project beyond the edges of the at least one ceramic layer forming projecting free edge sections;
   wherein the deforming comprises deforming the projecting free edge sections such that the projecting free edge sections are directly connected to each other in order to form a gas tight, sealed metal container enclosing a container interior for accommodating the at least one ceramic layer; wherein a porous material is present in the container interior in addition to the at least one ceramic layer, wherein the porous material absorbs a residual gas present in the container interior;
   hot isostatically pressing together the first and second metal layers in a treatment chamber at a gas pressure between 500 and 2000 bar and at a process temperature between 300° C. and a melting temperature of the first and second metal layers in order to produce a direct connection of the first and second metal layers and the at least one ceramic layer; and
   removing at least the projecting free edge sections of the first and second metal layers which are connected to each other via the direct connection to form the metal-ceramic substrate.

7. The method according to claim 6, wherein the porous material is evacuated and coated with a gas-tight sealing layer before the deforming.

8. The method according to claim 6, wherein the porous material is charged with oxygen and coated with a gas-tight sealing layer before the deforming.

9. The method according claim 1, wherein the at least one ceramic layer in the metal-ceramic stack is completely coated at its upper and/or lower side with a hard solder layer or an active solder layer.

10. The method according to claim 1, wherein the first and/or second metal layers are produced from copper or a copper alloy and/or an aluminium or an aluminium alloy.

11. The method according to claim 1, wherein the at least one ceramic layer is produced from an oxide, a nitride or carbide ceramic, aluminium oxide ($Al_2O_3$), an aluminium nitride (AlN), a silicon nitride ($Si_3N_4$), a silicon carbide (SiC) or an aluminium oxide with zirconium oxide ($Al_2O_3+ZrO_2$).

12. A metal ceramic substrate produced according to a method according to claim 1.

* * * * *